(12) United States Patent
Horn

(10) Patent No.: US 6,747,486 B2
(45) Date of Patent: Jun. 8, 2004

(54) COMPARATOR

(75) Inventor: Wolfgang Horn, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/244,810

(22) Filed: Sep. 16, 2002

(65) Prior Publication Data

US 2003/0058003 A1 Mar. 27, 2003

(30) Foreign Application Priority Data

Sep. 14, 2001 (DE) .......................... 101 45 562

(51) Int. Cl.$^7$ ................................ H03K 5/22
(52) U.S. Cl. ................................ 327/63; 327/66
(58) Field of Search .................. 327/63, 65, 66, 327/68, 69, 70, 307; 323/315, 316

(56) References Cited

U.S. PATENT DOCUMENTS 6,133,764 A    10/2000  Griffith et al. ............. 327/65
6,166,529 A  * 12/2000  Ikeuchi et al. ............. 323/315
6,480,038 B1 * 11/2002  Horn ......................... 327/66

FOREIGN PATENT DOCUMENTS

| DE | 32 42 417 C2 | 5/1983 |
| JP | 01 212 364 | 8/1989 |
| JP | 08 152 445 | 6/1996 |

* cited by examiner

*Primary Examiner*—Long Nguyen
(74) *Attorney, Agent, or Firm*—Laurence A. Greenberg; Werner H. Stemer; Gregory L. Mayback

(57) ABSTRACT

A comparator includes an adjustable offset and particularly dimensioned and configured components. The particular configuration and dimensioning of the comparator ensure that the offset voltage can be set precisely and permanently to a value, which can vary within a large range. The setting of an offset voltage does not lead to the degradation of other properties of the comparator, in particular to a slower reaction to changes in the input voltages.

14 Claims, 2 Drawing Sheets

COMPARATOR

BACKGROUND OF THE INVENTION

1. Field of the Invention

The present invention relates to a comparator for generating an output signal.

FIG. 1 shows a comparator, which is composed of two circuit branches that are connected to one another. The first circuit branch (designated by reference symbol SZ1 in FIG. 1) contains a first pnp-type transistor T1 and a first power source IQ1. A first voltage V1, which is one of voltages to be compared with one another, is supplied to the emitter of the transistor T1. The base and the collector of the transistor T1 are connected to ground via the power source IQ1.

The second circuit branch, which is designated by reference symbol SZ2 in FIG. 1, contains a first pnp-type transistor T2 and a first power source IQ2. A second voltage V2, which is the other of the voltages to be compared with, is applied to the emitter of the transistor T2. The collector of the transistor T2 is connected to ground via the power source IQ2, and to an output terminal O via which a signal representing the result of the comparison of the voltages VI and V2 is output. The base of the first transistor T1 and the base of the second transistor T2 are connected to one another.

A current I1, which is determined by the power source IQ1, flows through the first circuit branch SZ1. The potential which depends on the size of the voltage V1 is set at the base terminal of the transistor T1. A current I2, the size of which depends, on the difference between the voltages V1 and V2, to be more precise, on the voltage V2 and the base potential of the transistor T2 (that is dependent on the voltage V1), flows through the second circuit branch SZ2. A signal which can be tapped at the output terminal O depends on the the size of the current I2.

Such comparators are known, and further details of the same will not be described hereinafter.

The transistors T1 and T2 and the power sources IQ1 and IQ2 usually have the same dimensions. As a result, V1=V2 in the state of equilibrium (at the switch-over time) of the comparator. Otherwise, if, due to different dimensioning of the transistors and/or of the power sources, different base-emitter voltages are set at the transistors T1 and T2 in the state of equilibrium of the comparator, the applicable equation would be V1=V2±Voff in the state of equilibrium of the comparator. Voff is the known offset voltage.

The occurrence of an offset voltage is generally undesirable. At times, in particular if the comparator is to have a hysteresis, or if one of the voltages to be compared is to be a reference voltage which is not available in the configuration containing the comparator, it may be advantageous if an offset voltage is present, but such an offset voltage should be able to be set precisely and permanently to a specific value, and should preferably be variable within a relatively large range.

It would be possible to generate an offset voltage in the comparator shown in FIG. 1 by dimensioning the transistors T1 and T2 and/or the power sources IQ1 and IQ2 differently. The offset voltage Voff which is set as a result is $$Voff = \frac{kT}{q} \ln\left(\frac{I1}{I2}\right)$$

However, a disadvantage with this is that the offset voltage Voff is highly temperature-dependent. In addition, only small offset voltages (up to several mV) can be implemented. Otherwise, the ratio of I1 to I2 becomes too extreme.

An offset voltage generated in this way can be set neither precisely nor permanently, nor can it vary within a large range.

Another possible way of generating an offset voltage is illustrated in FIG. 2.

The configuration shown in FIG. 2 substantially corresponds to the comparator shown in FIG. 1. Elements which are designated with the same references refer to identical or corresponding elements.

However, the comparator of FIG. 2 additionally has a resistor R, which is disposed between the emitter of the second transistor T2 and the input terminal for the second voltage V2.

The offset voltage Voff, which is generated by the comparator is:

Voff=R·I2(for I1=I2), or $$Voff = R \cdot I2 + \frac{kT}{q} \ln\left(\frac{I1}{I2}\right) \text{ (for } I1 \neq I2\text{).}$$

A disadvantage with this is that the resistor R limits the current with which a capacitive load connected to the output terminal O can be recharged. The consequence is that the signal which is output via the output terminal O reacts relatively slowly to changes in V1 and/or V2. In other words, the comparator has a relatively slow switching behavior.

SUMMARY OF THE INVENTION

It is accordingly an object of the invention to provide a comparator configuration that overcomes the hereinafore-mentioned disadvantages of the heretofore-known devices of this general type, and to provide a comparator whose offset voltage can be set precisely and permanently to a value which can vary within a large range. The offset voltage of the comparator does not lead to the other properties of the comparator to be degraded. In particular, it does not lead to a slower reaction to changes in the input voltages.

With the foregoing and other objects in view, there is provided, in accordance with the invention, a comparator configuration containing a comparator having a first control device, a second control device, a resistor, a first power source and a second power source. The first control device has a first terminal, a second terminal, and a third terminal. The first terminal is used to input the first voltage. The second terminal is connected to the third terminal, and (via the resistor) to the terminal of the second control device. The third terminal is connected to the first power source. A current, whose size depends on the difference between the voltages applied to the first terminal and to the second terminal, flows through the third terminal.

The second control device has a first terminal, a second terminal, a third terminal and a fourth terminal. The first terminal is used to input the second voltage. The second terminal is connected to the fourth terminal, and to the second terminal of the first control device via the resistor.

The third terminal is connected to the second power source. A current, whose size depends on the difference between the voltages applied to the first terminal and to the second terminal, flows via the third terminal. The output signal of the comparator is tapped at the third terminal. The fourth terminal is connected to the second terminal. A current, whose size depends on the difference between the voltages applied to the first terminal and to the second terminal, flows via the fourth terminal.

In such a comparator, a defined current flows through the resistor in the state of equilibrium (at the switch-over time) of the comparator. The voltage drop (which is caused as a result) at the resistor equals to the offset voltage of the comparator or to one of the voltage components from which the offset voltage is composed.

In accordance with another feature of the invention, the difference between the voltages applied to the first terminal and to the second terminal of the first control device and the difference between the voltages applied to the first terminal and to the second terminal of the second control device are preferably equally large. The voltage drop across the resistor is precisely the offset voltage of the comparator.

The offset voltage can be set precisely and permanently to any desired values by appropriately dimensioning the resistor and/or the power sources. Since the resistor which generates the offset voltages is not in the path, via which the output terminal of the comparator is supplied with current, generating the offset voltage does not have any influence on the speed with which the output voltage can change.

In accordance with a further feature of the invention, the first power source outputs a current, and the second power source outputs another current. The control devices and the power sources are constructed and dimensioned in such a way that the current at the fourth terminal of the second control device depends on the current of the first power source and/or another current.

In accordance with an added feature of the invention, the control devices and the power sources are constructed and dimensioned in such a way that the current at the fourth terminal of the second control device and the another current of the second power source are equally large.

In accordance with an additional feature of the invention, there is provided a third power source, which is connected to the fourth terminal of the second control device. The third power source outputs a current.

In accordance with yet another feature of the invention, the resistor receives a current. The third power source is constructed in such a way that the current of the resistor is smaller, by an amount equal to the output current of the third power source, if the third power source is provided, than if not provided.

In accordance with yet a further feature of the invention, the resistor and the currents of the power sources have magnitudes, which are variable during an operation of the comparator.

In accordance with yet an added feature of the invention, a change in the magnitudes is carried out using one of switches and control elements, which can be controlled from outside the comparator.

In accordance with yet an additional feature of the invention, the first control device includes a first transistor selected from a bipolar junction transistor and/or a field-effect transistor. The bipolar junction transistor includes an emitter, a base, and a collector. The field-effect transistor includes a source, a gate, and a drain. The first transistor having an emitter and or a source forming the first terminal of the first control device. It further includes a base or a gate, which form the second terminal of the first control device, and a collector or a drain, which form the third terminal of the first control device.

In accordance with again another feature of the invention, the second control device includes second and third transistors also selected from the bipolar junction transistor and/or the field-effect transistor. The second and third transistors having emitter or source terminals and base or gate terminals connected to one another. A common emitter or source terminal forms the first terminal of the second control device. A common base or gate terminal forms the second terminal of the second control device. A collector or drain terminal of the second transistor forms the third terminal of the second control device. A collector or drain terminal of the third transistor forms the fourth terminal of the second control device.

In accordance with again a further feature of the invention, the first, second and third transistors and the power sources are dimensioned in such a way that a same base-emitter voltage or gate-source voltage is set at the first, second and third transistors in the state of equilibrium of the comparator.

In accordance with again an added feature of the invention, the first, second and third transistors have currents flowing through them. The first, second and third transistors and the power sources are dimensioned in such a way that the currents of the first, second and third transistors are equally large in the state of equilibrium.

In accordance with again an additional feature of the invention, the power sources are dimensioned in such a way that the output current of the first power source is twice as large as the output current of the second power source, if the third power source is not provided.

In accordance with a concomitant feature of the invention, the power sources are dimensioned in such a way that the output current of the first power source is smaller, by an amount equal to the output current of the third power source, than twice the output current of the second power source, when the third power source is provided.

Other features which are considered as characteristic for the invention are set forth in the appended claims.

Although the invention is illustrated and described herein as embodied in a comparator, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of specific embodiments when read in connection with the accompanying drawings.

DESCRIPTION OF THE PREFERRED EMBODIMENTS

Figure 1:
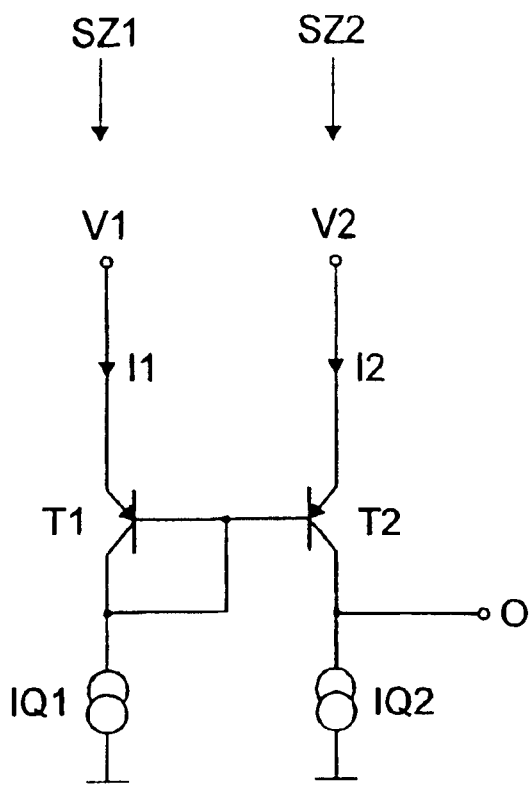
FIG. 1 is a schematic circuit diagram of a conventional comparator.

According to the circuit diagram shown in FIG. 3, the comparator, which is described below in more detail, is constructed of a first control device S1, a second control device S2, a first power source IQ11, a second power source IQ12, a third power source IQ13 and a resistor Roff. The third power source IQ13 may be omitted.

The comparator receives a first input voltage V11 and a second input voltage V12 and generates an output signal OUT which is dependent on the size ratio of these voltages.

The first control device S1 has three terminals A11 to A13. The first terminal A11 is used to input the voltage V1. The second terminal A12 is connected to a second terminal A22 of a second control device S2 via the resistor Roff, and to the third terminal A13. The third terminal A13 is connected to ground via the first power source IQ11. The second control device S2 has four terminals A21 to A24. The first terminal A21 is used to input the voltage V12 and the second terminal A22 is connected (via the resistor Roff) to the second terminal A12 of the first control device S1, and is further connected to the fourth terminal A24. The third terminal A23 is connected to ground via the second power source IQ12. The fourth terminal A24 is connected to ground via the third power source IQ13 (if the third power source IQ13 is provided).

The first control device S1 behaves in such a way that a current, whose size depends on the difference between the voltage V11 applied to the first terminal A11 and the voltage applied to the second terminal A12, flows via the third terminal A13.

The second control device S2 behaves in such a way that currents whose size depends on the difference between the voltage V12 applied to the first terminal A21 and the voltage applied to the second terminal A22 flow via the third terminal A23 and via the fourth terminal A24.

As a result, a defined current flows through the resistor Roff in the state of equilibrium (at the switch-over time) of the comparator. The voltage drop across the resistor is the offset voltage of the comparator or one of the voltage components from which the offset voltage is composed.

The difference between the voltages supplied to the first terminal A11 and to the second terminal A12 of the first control device S1, and the difference between the voltages applied to the first terminal A21 and to the second terminal A22 of the second control device S2, are preferably equally large. The voltage drop across the resistor Roff is then precisely the offset voltage of the comparator.

The offset voltage can be set precisely and permanently to any desired values by appropriately dimensioning the resistor Roff and/or the power sources IQ11 to IQ13. Moreover, the resistor which generates the offset voltage does not lie in the path via which the output terminal OUT of the comparator is supplied with a current so that the generation of the offset voltage does not have any influence on the speed with which the output signal can change.

Figure 3:
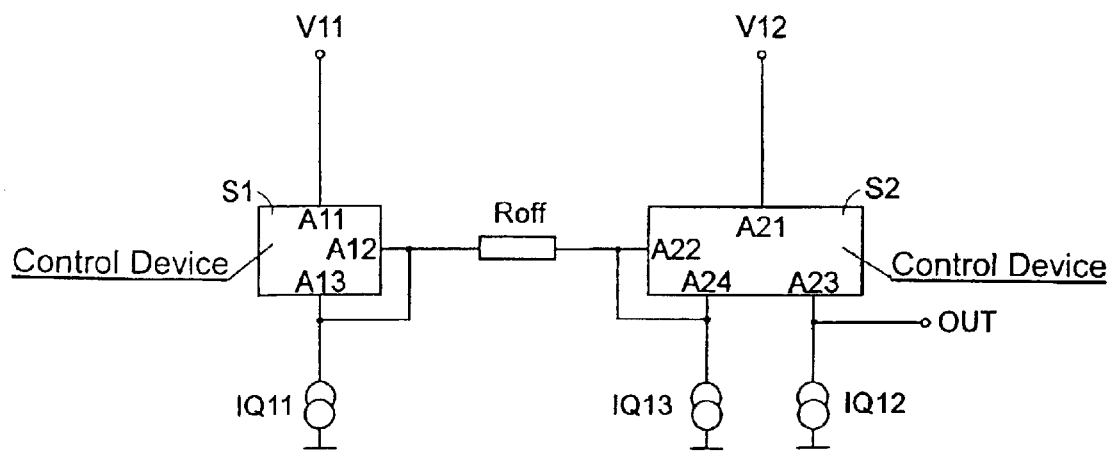
FIG. 3 is a schematic and block circuit diagram of a comparator according to the invention.
Figure 4:
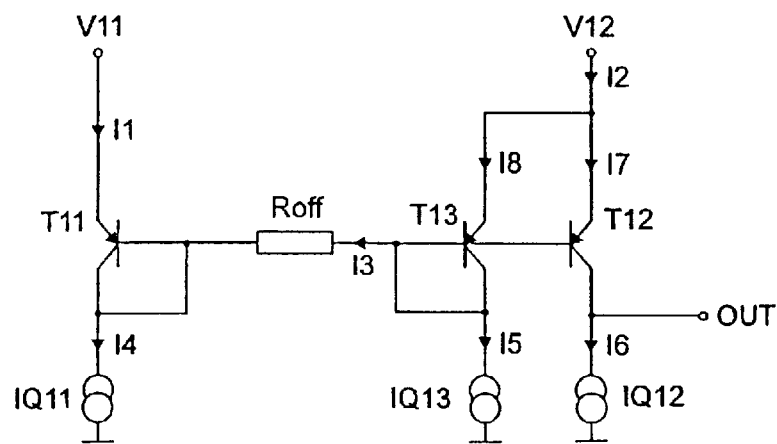
FIG. 4 is a schematic circuit diagram of an exemplary implementation of the comparator of FIG. 3.

An exemplary embodiment (which may be a practical implementation) of the circuit of FIG. 3 is illustrated in FIG. 4.

In the circuit of FIG. 4, the first control device S1 is formed by a first pnp-type transistor T11. The emitter terminal of the transistor T11 corresponds to the first terminal A11 of the first control device S1, the base terminal of the transistor T11 corresponds to the second terminal A12 of the first control device S1, and the collector terminal of the transistor T11 corresponds to the third terminal A13 of the first control device S1.

The second control device S2 is formed by a second pnp-type transistor T12 and a third pnp-type transistor T13, the emitter terminals (connected to one another) of the transistors T12 and T13 corresponding to the first terminal A21 of the second control device S2, the base terminals (connected to one another) of the transistors T12 and T13 corresponding to the second terminal A22 of the second control device S2, the collector terminal of the second transistor T12 corresponding to the third terminal A23 of the second control device S2, and the collector terminal of the third transistor T13 corresponding to the fourth terminal A24 of the second control device S2.

The components of the comparator, to be more precise, the transistors T11 to T13 and the power sources IQ11 to IQ13, are preferably dimensioned in such a way that the offset voltage of the comparator, which is generated intentionally, is the voltage which drops across the resistor Roff and does not contain any further components. To achieve this, it is necessary for the base-emitter voltages of the transistors T11 to T13 to be equally large in the state of equilibrium (at the switch-over time) of the comparator. This can be achieved most easily by implementing the transistors T11 to T13 as identical transistors, and by ensuring that the currents crossing the transistors T11 to T13 are equally large by correspondingly dimensioning the power sources.

It is possible to ensure that the currents are equally large by the fact that when no third power source IQ13 is provided, the current which is supplied by the first power source IQ11 is twice as large as the current supplied by the second power source IQ12, and by the fact that, when the third power source IQ13, is provided, the current supplied by the first power source IQ11 is smaller (by an amount equal to the current supplied by the third power source IQ13) than twice the current supplied by the second power source IQ12.

Figure 2:
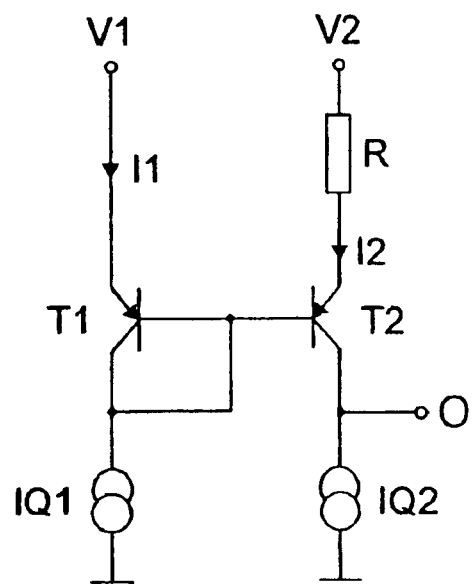
FIG. 2 is a schematic circuit diagram of a comparator with an adjustable offset.

There is no absolute necessity for the transistors T11 to T13 and the power sources IQ11 to IQ13 to be dimensioned as mentioned. However, then the generated offset voltage does not correspond to the voltage drop across the resistor Roff, but rather contains (as in the case of the offset voltage of the comparator of FIG. 2 when I1≠I2) a further heavily temperature-dependent component. The temperature-dependent component might generally be undesirable, but is not disruptive under certain circumstances.

The below-description takes into account that the transistors T11 to T13 and the power sources IQ11 to IQ13 are dimensioned as mentioned above.

An explanation of how the offset voltage drop across the resistor Roff can be set to a desired value is given below.

Referring to currents I1 to I8, the current I1 is the current flowing through the transistor T11. The current I2 is the sum of the currents flowing through the transistors T12 and T13, and the current I3 is the current flowing through the resistor Roff. The current I4 is the current which is output by the power source IQ11. The current I5 is the current which is output by the power source IQ13. The current I6 is the current which is output by the power source IQ12. The current I7 is the current flowing through the transistor T12, and the current I8 is the current flowing through the transistor T13. The base currents of the transistors are ignored.

As can be inferred, in particular from FIG. 4 and the related description, the offset voltage, which is generated by the comparator described above, is the voltage drop Voff across the resistor Roff. In other words, Voff=Roff*I3, and can consequently be set by appropriately dimensioning the resistor Roff and/or the current I3.

The way in which the current I3 can be influenced depends on whether or not the third power source IQ13 is present. These two cases are therefore considered separately below.

In both the cases, it is assumed that I1=I7=I8, which is automatically the case when the conditions mentioned above are fulfilled. The conditions have to be fulfilled so that the offset voltage to be generated will be equal to the voltage drop across the resistor Roff.

Furthermore, it is assumed that the output OUT is entirely capacitatively loaded so that I7=I6.

If the third power source IQ13 is not present, I5=0 and I3=I8. Since I1=I7=I8 and I7=I6, it is also true that I3=I6. Thus, the offset voltage Voff is Voff=Roff*I6.

Therefore, Voff can be set or varied by changing Roff and/or I6.

If the third power source IQ13 is present, I5≠0, and I3=I8−I5. Since I1=I7=I8 and I7=I6, it is also true that I8=I6. The offset voltage Voff is Voff=Roff*(I6−I5). Therefore, Voff can be set or varied by changing Roff, I5 and I6.

It is possible to set the offset voltage precisely and permanently to a desired value in an extremely easy way by using the comparator described above. The offset voltage which is set is not temperature-dependent, and can vary within a very large range. Further, the offset voltage can be changed by appropriately changing the size of the resistor Roff and/or the size of the currents of the power sources (the current flowing across the resistor depends on the dimensions of the power sources) even while the comparator is operating. Changes in the size of the resistor Roff and/or the size of the currents of the power sources can be carried out, for example, using switches or control elements that can be controlled from outside the comparator.

Further, generating the offset voltage does not influence, or at any rate, does not necessarily influence, the switching speed of the comparator. The switching speed, when the output signal of the comparator switches over from the low level to the high level is determined by the current I2 or I7. The circuit branch through which the current flows does not (in contrast to the comparator in FIG. 2) contain a resistor which limits the flow of current or any other loads. The switching speed, when the output signal of the comparator switches over from the high level to the low level, is determined by the current I6. The switching speed can be changed, but does not have to be changed, in order to set the offset voltage as desired. The offset voltage can also be set or changed by the resistor Roff.

If the third power source IQ13 is provided, the offset voltage can also be set or changed by correspondingly setting or changing the current I5, which is output by the third power source. Providing the third power source IQ13 makes it possible to vary the offset voltage within a range, which is of theoretically unlimited size, without having to change the current I6, which is output by the second power source IQ12. As a result, the offset voltage and the switching speed of the comparator can be set or varied within very large ranges, independently and without influencing one another.

It should be apparent that the transistors T11 to T13 do not have to be implemented as pnp-type transistors. They can also be implemented, possibly after appropriate adaptation of the comparator configuration, as any other transistors: for example, npn-type transistors or field-effect transistors.

The transistors T12 and T13 can also be formed by a single transistor with two collectors.

Independent of practical implementations, the comparator described above permits the offset voltage to be set precisely and permanently to a value which can be varied within a large range. Further, the comparator can prevent the setting of the offset voltage, which leads to the degradation of the other properties of the comparator: in particular, a slower reaction to changes in the input voltages.

I claim:

1. A comparator for generating an output signal in dependence on a size ratio of a first voltage and a second voltage, the comparator comprising:

control devices including a first control device and a second control device;

a resistor;

power sources including a first power source and a second power source;

said first control device having a first terminal, a second terminal, and a third terminal;

said second control device having a first terminal, a second terminal, a third terminal and a fourth terminal;

said first terminal of said first control device receiving the first voltage;

said second terminal of said first control device connected to said third terminal of said first control device, and to said second terminal of said second control device through said resistor;

said third terminal of said first control device connected to said first power source, and said third terminal of said first control device receiving a first current having a size depending on a difference between the voltage at said first terminal of said first control device and the voltage at said second terminal of said first control device;

said first terminal of said second control device receiving the second voltage;

said second terminal of said second control device connected to said fourth terminal of maid second control device;

said third terminal of said second control device connected to maid second power source, and receiving a second current having a size depending on a difference between the voltage at said first terminal of said second control device and the voltage at said second terminal of said second control device;

said third terminal of said second control device providing the output signal of said comparator to an output terminal; and said fourth terminal of said second control device receiving a third current having a size depending on the difference between the voltage at said first terminal of said second control device and the voltage at said second terminal of said second control device.

2. The comparator according to claim 1, wherein said control devices and said power sources are constructed and dimensioned in such a way that the difference between the voltage applied to said first terminal and the voltage applied to said second terminal of said first control device and the difference between the voltage applied to said first terminal and the voltage applied to said second terminal of said second control device are equally large.

3. The comparator according to claim 1, wherein said first power source outputs a fourth current, and said second power source outputs a fifth current, said control devices and said power sources are constructed and dimensioned in such a way that the third current at said fourth terminal of said second control device depends on at least one of the fourth current of said first power source and the fifth current.

4. The comparator according to claim 3, wherein said control devices and said power sources are constructed and dimensioned in such a way that the third current at said fourth terminal of said second control device and the fifth current of said second power source are equally large.

5. The comparator according to claim 3, further comprising a third power source connected to said fourth terminal of said second control device, said third power source selectively outputting a sixth current.

6. The comparator according to claim 5, wherein said resistor receives a seventh current, and said third power source is constructed in such a way that the seventh current of said resistor is smaller, by an amount equal to the sixth current of said third power source, if the sixth current from said third power source is provided, than if the sixth current is not provided.

7. The comparator according to claim 6, wherein said resistor and the currents of said power sources have variable magnitudes during an operation of said comparator.

8. The comparator according to claim 7, wherein a change in the magnitudes is carried out using one of switches and control elements, said one of switches and control elements being configured to be controlled from outside said comparator.

9. The comparator according to claim 1, wherein said first control device includes a first transistor selected from the group consisting of a bipolar junction transistor having an emitter forming said first terminal of said first control device, a base forming said second terminal of said first control device, and a collector forming said third terminal of said first control device and a field-effect transistor having a source forming said first terminal of said first control device, a gate forming said second terminal of said first control device, and a drain forming said third terminal of said first control device.

10. The comparator according to claim 9, wherein said second control device includes second and third transistors selected from the group consisting of a bipolar junction transistor and a field-effect transistor, the bipolar junction transistor having an emitter, a base, and a collector, the field-effect transistor having a source, a gate, and a drain, said second transistor and third transistor having emitter or source terminals and base or gate terminals connected to one another, a common emitter or source terminal forms said first terminal of said second control device, a common base or gate terminal forms said second terminal of said second control device, a collector or drain terminal of said second transistor forms said third terminal of said second control device, and a collector or drain terminal of said third transistor forms said fourth terminal of said second control device.

11. The comparator according to claim 10, wherein said first, second and third transistors and said power sources are dimensioned an such a way that a name base-emitter voltage or gate-source voltage is set at said first, second and third transistors in a state of equilibrium of said comparator.

12. The comparator according to claim 10, wherein said first, second and third transistors have currents flowing through therein, and said first, second and third transistors and said power sources are dimensioned in such a way that the currents of said first, second and third transistors are equally large in a state of equilibrium.

13. The comparator according to claim 5, wherein said power sources are dimensioned in such a way that the output current of said first power source is twice as large as the output current of said second power source, if said third power source is not provided.

14. The comparator according to claim 5, wherein said power sources are dimensioned in such a way that the output current of said first power source is smaller, by an amount equal to the output current of said third power source, than twice the output current of said second power source when said third power source is provided.

* * * * *

UNITED STATES PATENT AND TRADEMARK OFFICE
CERTIFICATE OF CORRECTION

PATENT NO. : 6,747,486 B2 Page 1 of 1
DATED : June 8, 2004
INVENTOR(S) : Wolfgang Horn It is certified that error appears in the above-identified patent and that said Letters Patent is hereby corrected as shown below:

Column 8,
Line 33, should read as follows:
-- nected to said fourth terminal of said second control --
Line 36, should read as follows:
-- nected to said second power source, and receiving a --

Column 10,
Line 15, should read as follows:
-- dimensioned in such a way that a same base-emitter voltage --

Signed and Sealed this

Seventh Day of December, 2004

JON W. DUDAS
*Director of the United States Patent and Trademark Office*